US008917147B2

(12) United States Patent
Vasishtha et al.

(10) Patent No.: US 8,917,147 B2
(45) Date of Patent: Dec. 23, 2014

(54) METHOD AND SYSTEM TO IMPROVE POWER UTILIZATION USING A CALIBRATED CRYSTAL WARM-UP DETECTION

(71) Applicant: Broadcom Corporation, Irvine, CA (US)

(72) Inventors: Praveen Vasishtha, San Diego, CA (US); Satyaprasad Srinivas, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 82 days.

(21) Appl. No.: 13/715,057

(22) Filed: Dec. 14, 2012

(65) Prior Publication Data

US 2014/0167866 A1 Jun. 19, 2014

(51) Int. Cl.

| | |
|---|---|
| ***H03B 5/30*** | (2006.01) |
| ***H03B 5/36*** | (2006.01) |
| ***G01R 35/00*** | (2006.01) |
| *H03B 5/06* | (2006.01) |

(52) U.S. Cl.

CPC ................ *G01R 35/005* (2013.01); *H03B 5/36* (2013.01); *H03B 5/06* (2013.01); *H03B 2200/0094* (2013.01)

USPC ................. 331/116 R; 331/116 FE; 331/154; 331/158; 327/47; 327/48; 327/49

(58) Field of Classification Search

CPC .... H03B 5/36; H03B 5/06; H03B 2200/0094; G01R 35/005

USPC .......... 331/116 FE, 116 R, 154, 158; 327/47, 327/48, 49

See application file for complete search history.

(56) References Cited

U.S. PATENT DOCUMENTS 5,657,361 A * 8/1997 Inagaki et al. .................. 377/39
6,304,517 B1 * 10/2001 Ledfelt et al. .................. 368/10

* cited by examiner

*Primary Examiner* — Arnold Kinkead
*Assistant Examiner* — Richard Tan
(74) *Attorney, Agent, or Firm* — Sterne, Kessler, Goldstein & Fox P.L.L.C.

(57) ABSTRACT

A calibrated crystal warm-up method that can include determining the number of clock cycles of a crystal clock reference signal from a crystal oscillator occur during a single clock cycle of a low-power oscillator. Further, the determination can occur when the crystal oscillator is warmed up. The method can also include comparing a number of clock cycles of the crystal clock reference signal with a previously determined number of clock cycles of the crystal clock reference signal to indicate whether the crystal oscillator is warmed up. Further, the method can include counting the number of clock cycles of a low-power clock reference signal have occurred up until the time it has been determined that the crystal oscillator has been warmed up.

20 Claims, 7 Drawing Sheets

METHOD AND SYSTEM TO IMPROVE POWER UTILIZATION USING A CALIBRATED CRYSTAL WARM-UP DETECTION

FIELD

This application relates generally to power management in embedded systems, and more particularly to the improving power management utilizing a calibrated crystal warm-up process.

BACKGROUND

The power management of embedded systems includes periodic sleep/wake cycles for the various integrated circuits ("ICs") within the embedded systems. During the sleep/wake cycles, the various ICs transition between a low-power mode (sleep mode) and a normal-power mode (wake mode) to conserve power.

An embedded system utilizes a crystal oscillator ("XO") to generate a reference clock signal for the various ICs included within the embedded system. During a low-power (sleep) mode, the crystal oscillator is powered off along with one or more of the various ICs. An external low-power oscillator (LPO) may be used as a clock reference within the embedded system during the low-power mode. While transitioning from a low-power mode to a normal-power mode, the crystal oscillator begins a warm-up sequence to warm-up the crystal oscillator.

To maintain the accuracy of the crystal oscillator, the embedded system does not enter the normal-power (wake) mode until the crystal oscillator has completed the warm-up sequence. The embedded system operates in the warm-up sequence for a time period that accounts for manufacturing tolerances of the crystal oscillator. That is, the length of the warm-up sequence for a particular crystal oscillator typically exceeds the actual warm-up time needed for that particular crystal oscillator. Consequently, the allotted time period in which the crystal oscillator may remain in a sleep state for a particular sequence is reduced to account for the compensated warm-up time, thereby limiting the potential power savings that occur during the sleep state.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

Figure 1:
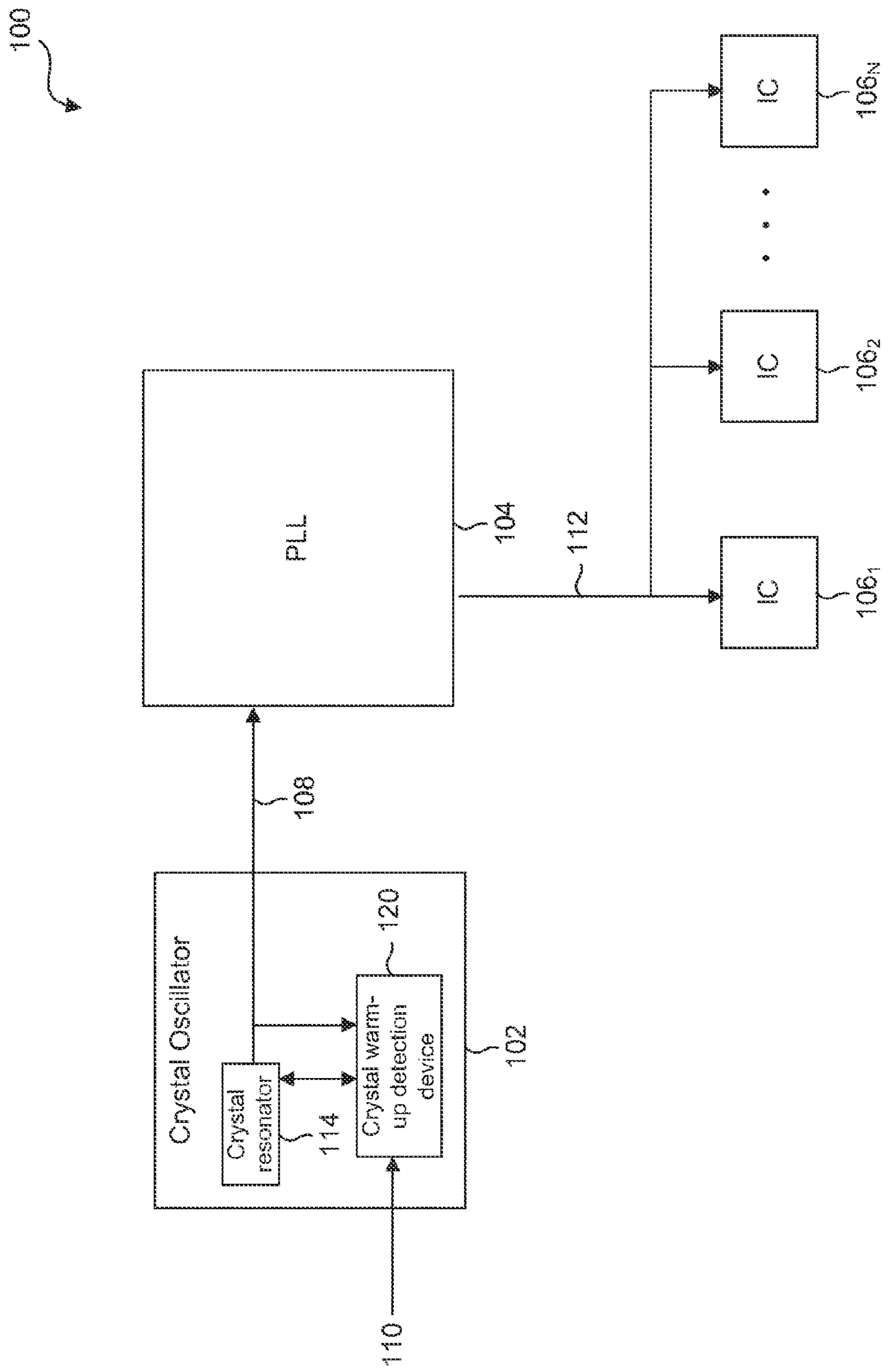
FIG. 1 illustrates an exemplary embedded system in accordance with an exemplary embodiment of the present disclosure.

FIG. 1 illustrates an exemplary embedded system 100 in accordance with an exemplary embodiment of the present disclosure. The embedded system 100 provides a reference clock signal from a crystal oscillator to one or more integrated circuits included in the system. The embedded system 100 can include a crystal oscillator 102, a phase locked loop (PLL) 104 and one or more integrated circuits (ICs) $\mathbf{106}_1$-$\mathbf{106}_N$.

The crystal oscillator 102 includes suitable logic, circuitry, and/or code that can be configured to generate a crystal clock reference signal 108 having a precise frequency. The crystal oscillator 102 can include a crystal resonator 114 that may be configured to create an oscillating signal at the precise frequency when provided an appropriate bias. The crystal oscillator 102 can generate a crystal clock reference signal 108 at a frequency of, for example, 26 megahertz (MHz). The frequency of the generated clock reference signal 108 should not be limited to 26 MHz, and the generated frequency can be any frequency that will be apparent to those skilled in the relevant art(s) without departing from the spirit and scope of the present disclosure.

In an exemplary embodiment of present disclosure, the crystal oscillator 102 can include a crystal warm-up detection device 120. As discussed in more detail below with reference to FIG. 2, the crystal warm-up detection device 120 includes suitable logic, circuitry, and/or code that can be configured to measure and/or process the warm-up time of the crystal oscillator 102. The crystal warm-up detection device 120 can utilize a low-power clock reference signal 110 provided by an external low-power oscillator (LPO) and the crystal clock reference signal 108 in measuring and/or processing the warm-up time of the crystal oscillator 102.

The crystal oscillator 102 can include, but is not limited to, several well-known manufactured types such as an Analog Temperature Controlled Crystal Oscillator (ATCXO), a Digital Temperature Controlled Crystal Oscillator (DTCXO), an Evacuated Miniature Crystal Oscillator (EMXO), a Global Positioning System Disciplined Oscillator (GPSDO), a Microcomputer Compensated Crystal Oscillator (MCXO), an Oven-Controlled/Voltage-Controlled Crystal Oscillator (OC/VCXO), an Oven-Controlled Crystal Oscillator (OCXO), a Rubidium-Crystal Oscillator (RbXO), a Temperature-Compensated/Voltage-Controlled Crystal Oscillator (TCVCXO), a Temperature Compensated Crystal Oscillator (TCXO), a Tactical Miniature Crystal Oscillator (TMXO), a Temperature Sensing Crystal Oscillator (TSXO), a Voltage-Controlled Temperature Crystal Oscillator (VCTCXO), or a Voltage-Controlled Crystal Oscillator (VCXO), or the like.

The phase locked loop (PLL) 104 includes suitable logic, circuitry, and/or code that can be configured to generates a primary reference clock (PCR) signal 112 whose phase is related to the phase of the crystal clock reference signal 108 provided by the crystal oscillator 102. For example, the PLL 104 can generate a PCR signal whose frequency is a rational multiple of the frequency of the crystal clock reference signal 108. Fractional PLLs can also be utilized.

The one or more integrated circuits (ICs) $\mathbf{106}_1$-$\mathbf{106}_N$ include suitable logic, circuitry, and/or code that can be configured to perform various operations. For example, the integrated circuits may be configured to perform wireless transmission and/or wireless reception utilizing one or more various wireless communication protocols, such as Wi-Fi (IEEE 802.11), Bluetooth (IEEE 802.15), Near-field Communication (NFC) (ISO/IEC 18092), WiMax (IEEE 802.16), one or more various cellular protocols specified in the International Mobile Telecommunications-2000 (IMT-2000) standard, developed by the 3rd generation partnership project (3GPP), and/or developed by the 3$^{rd}$ generation partnership project 2 (3GPP2), or the like. These various standards are all incorporated by reference in their entirety. Although several exemplary wireless communication protocols have been discussed, the ICs 106 should not be limited to wireless communication ICs, and can also include ICs configured to perform any operation that will be apparent to those skilled in the relevant art(s) without departing from the spirit and scope of the present disclosure.

Figure 2:
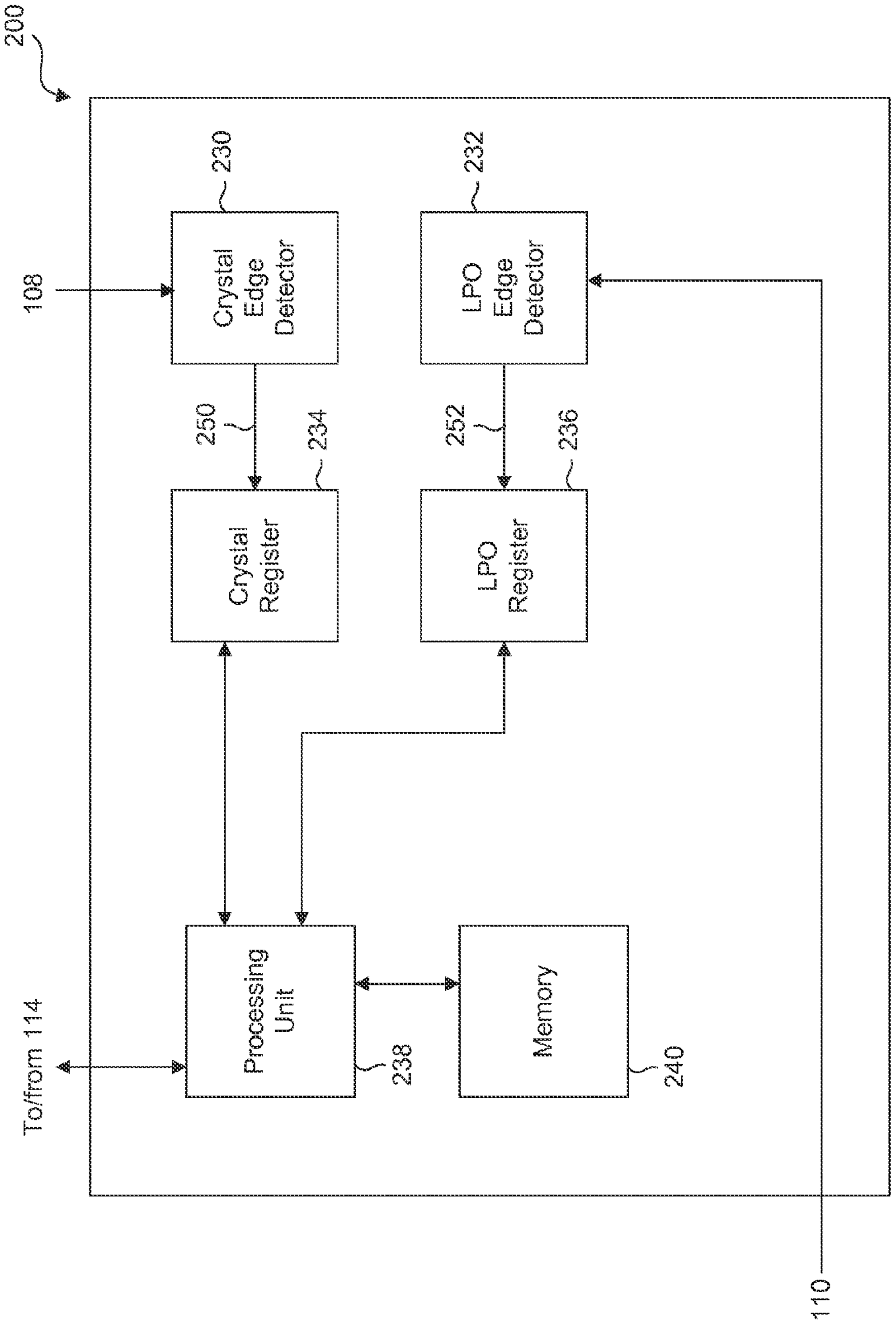
FIG. 2 illustrates a block diagram of an exemplary warm-up detection device in accordance with an exemplary embodiment of the present disclosure.

FIG. 2 illustrates a crystal warm-up detection device 220 in accordance with an exemplary embodiment of the present disclosure. The crystal warm-up detection device 220 includes suitable logic, circuitry, and/or code that can be configured to measure and/or process the warm-up time of a crystal oscillator (e.g., crystal oscillator 102 of FIG. 1). The crystal warm-up detection device 220 can utilizes a low-power clock reference signal 110 provided by an external low-power oscillator (LPO) and the crystal clock reference signal 108 in measuring and/or processing the warm-up time of the crystal oscillator 102.

The crystal warm-up detection device 220 can include crystal edge detector 230, LPO edge detector 232, crystal register 234, LPO register 236, processing unit 238, and memory 240.

The crystal edge detector 230 includes suitable logic, circuitry, and/or code that can be configured to detect an edge of the crystal clock reference signal 108 from the crystal oscillator 102. For example, the crystal edge detector 230 can be configured to detect the rising and/or falling edge of the crystal clock reference signal 108, and to output a crystal edge detection signal 250 indicative of the presence of a rising and/or falling edge of the crystal clock reference signal 108.

The LPO edge detector 232 includes suitable logic, circuitry, and/or code that can be configured to detect an edge of a low-power clock reference signal 110 provided by the LPO. For example, the LPO edge detector 232 can be configured to detect the rising and/or falling edge of the low-power clock reference signal 110, and to output a LPO edge detection signal 252 indicative of the presence of a rising and/or falling edge of the low-power clock reference signal 110.

The LPO can generate a low-power clock reference signal 110 at a frequency of, for example, 32768 hertz (Hz). The frequency of the generated low-power clock reference signal 110 is not be limited to 32768 Hz, as the generated frequency can be any frequency that will be apparent to those skilled in the relevant art(s) without departing from the spirit and scope of the present disclosure. The LPO signal 110 is not as precise in frequency as the crystal clock reference signal 108, but is generated from a lower power oscillator than that of the crystal clock reference signal 108.

The crystal register 234 includes suitable logic, circuitry, and/or code that can be configured to store bits of information. For example, the crystal register 234 can include one or more flip-flops, where each flip-flop is configured to store one bit of information. In an exemplary embodiment of the present disclosure, the crystal register 234 can count the cycles of the crystal oscillator 102 based on the crystal edge detection signal 250 provided by the crystal edge detector 230. For example, the crystal register 234 can increment the stored value within the crystal register 234 upon each rising edge of the crystal clock reference signal 108 detected by the crystal edge detector 230.

The LPO register 236 includes suitable logic, circuitry, and/or code that can be configured to store bits of information. For example, the LPO register 236 can include one or more flip-flops, where each flip-flop is configured to store one bit of information. In an exemplary embodiment of the present disclosure, the LPO register 236 can count the cycles of the LPO based on the LPO edge detection signal 252 provided by the LPO edge detector 232. For example, the LPO register 236 can increment the stored value within the LPO register 236 upon each rising edge of the low-power clock reference signal 110 detected by the LPO edge detector 232.

The processing unit 238 (e.g., central processing unit (CPU), or the like) includes suitable logic, circuitry, and/or code that can be configured to control overall operation and/or configuration of the crystal warm-up detector 220. For example, the processing unit 238 can read information from crystal register 234 and/or the LPO register 236, as well as write information to crystal register 234 and/or the LPO register 236. Further, processing unit 238 can also read and/or write information to and/or from memory 240. The processing unit 238 can also process the information read from the crystal register 234, LPO register 236, and/or memory 240. Further, the processing unit 238 can instruct the crystal register 234 and/or the LPO register 236 to be reset. When the crystal register 234 and/or the LPO register 236 are reset, one or more bits of information stored in within the reset register(s) is erased. The reset process can include the deletion of the stored information and/or the overwriting of the stored information with new information by the processing unit 238.

Memory 240 includes suitable logic, circuitry, and/or code that can be configured to store information. For example, memory 240 can include machine-readable mediums that may include, but are not limited to, read only memory (ROM), random access memory (RAM), magnetic disk storage media, optical storage media, flash memory devices, or the like. Further, any of the various forms of machine-readable mediums included in the memory 240 can be volatile and/or non-volatile. In an embodiment of the present disclosure, memory 240 can store information that has been stored in the crystal register 234 and/or the LPO register 236.

Figure 3A:
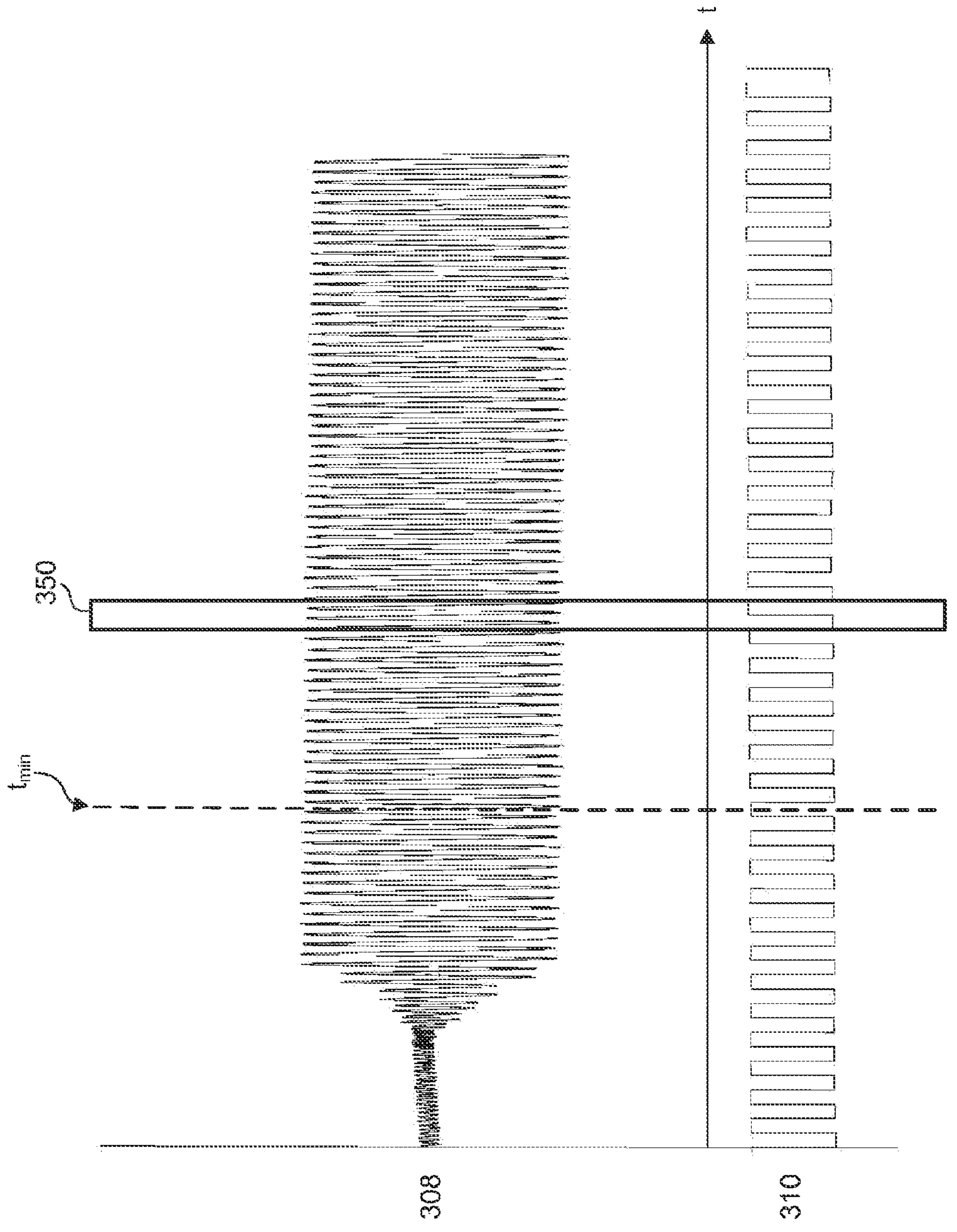
FIG. 3A illustrates an exemplary timing diagram in accordance with an exemplary embodiment of the present disclosure.
Figure 3B:
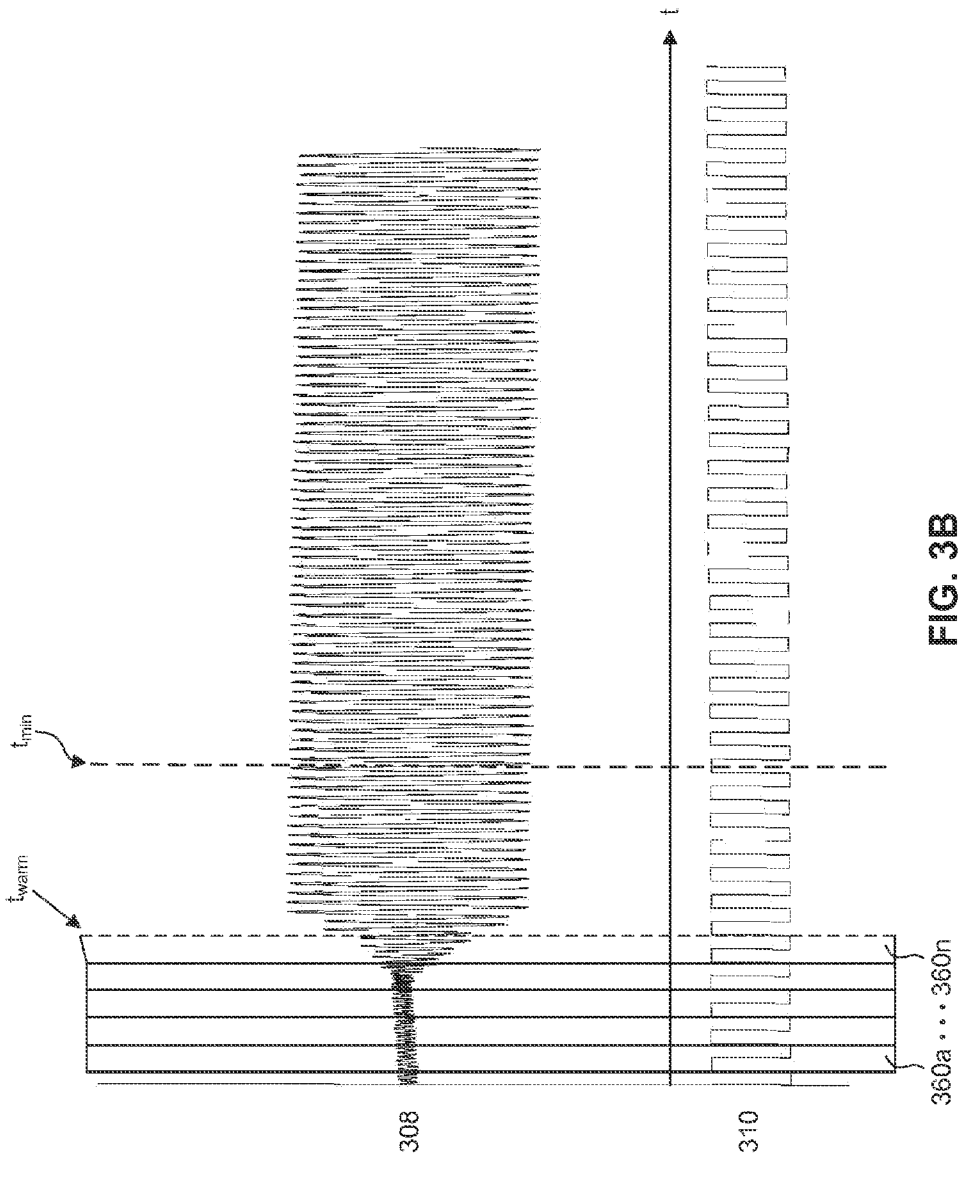
FIG. 3B illustrates an exemplary timing diagram in accordance with an exemplary embodiment of the present disclosure.

With reference to FIGS. 3A and 3B, and continued reference to FIGS. 1 and 2, the operation of the crystal warm-up detector 220 will be described in an exemplary embodiment of the present disclosure.

FIG. 3A illustrates a calibration operation of a crystal oscillator 102 of a crystal warm-up detector 220 where signal 308 is an example embodiment of crystal clock reference signal 108 and signal 310 is an example embodiment of low power clock reference signal 110. In an exemplary embodiment, the calibration of a crystal oscillator 102 can be performed following the powering on of the system 100. Alternatively, the calibration operation can be performed during the manufacturing process of the system 100 rather than on each power cycle, or in addition to being performed upon each of the power cycles. For the purposes of this discussion, the calibration operation will be performed each time the system 100 is powered on.

The calibration process is performed following the completion of a warm-up sequence by the crystal oscillator 102. That is, the calibration process is performed after the crystal oscillator 102 has had sufficient time to fully warm up. To ensure that crystal oscillator 102 has fully warmed up, the calibration of the crystal warm-up detector 220 can be performed at a time that exceeds a manufacturer-specified minimum crystal warm-up time ($t_{min}$). In particular, to account for manufacturing tolerances of the crystal oscillator 102 (and/or crystal resonators), the calibration can be performed at a time that greatly exceeds such manufacture-specified minimum time $t_{min}$.

In an exemplary embodiment of the present disclosure, the processing unit 238, crystal edge detector 230, LPO edge detector 232, crystal register 234, and LPO register 236 are configured to calibrate crystal oscillator 102. In particular, the processing unit 238 can perform a sampling 350 of the crystal clock reference signal 308 to determine the number of clock cycles of the crystal clock reference signal 308 that are within a single clock cycle of the LPO's low-power clock reference signal 310.

For example, the crystal edge detector 230 can detect each rising edge of the crystal clock reference signal 308 and provide the crystal register 234 with the crystal edge detection signal 250. The crystal register 234 can count the received crystal edge detection signals 250 and can store a corresponding value representing the total counted rising edges.

Similarly, the LPO edge detector 232 can be used to detect the rising edges of the low-power clock reference signal 310 and provide LPO register 236 with a LPO edge detection signal 252. The LPO register 236 can count the received LPO edge detection signals 252 and can store a corresponding value representing the total counted rising edges of the low-power clock reference signal 110. The processing unit 238 can monitor the LPO register 236 to determine when a single clock cycle of the low-power clock reference signal 110 has been completed, thereby completing the sample period 350.

When the processing unit 238 determines that a complete clock cycle of the low-power clock reference signal 110 has been performed, the processing unit 238 can read the value stored in the crystal register 234 corresponding to the total clock cycles of the crystal edge detection signal 250 ($C_{warm}$). As illustrated in FIG. 3A, the sampling 350 is taken for a single cycle of the LPO's low-power clock reference signal 310 and is performed after the manufacturer-specified minimum crystal warm-up time $t_{min}$. The total clock cycles of the crystal edge detection signal 250 ($C_{warm}$) can be used to indicate that the crystal oscillator 102 has sufficiently warmed up. The total clock cycles of the crystal edge detection signal 250 ($C_{warm}$) can be stored in the memory 240 and can be accessible by the processing unit 238.

FIG. 3B illustrates a LPO calibration operation of a crystal warm-up detector 220. In particular, the LPO calibration operation can determine the total number of clock cycles of the LPO's low-power clock reference signal 310 that are completed during a warm-up sequence. That is, the number of clock cycles of the low-power clock reference signal 310 it will take for the crystal oscillator 102 to fully warm up.

For the purpose of this discussion, the LPO calibration process is performed following the calibration of the crystal oscillator 102 illustrated in FIG. 3A. In particular, the calibration of the LPO's low-power clock reference signal 310 utilizes the total clock cycles of the crystal edge detection signal 250 ($C_{warm}$), which indicates that the crystal oscillator 102 has warmed up. In an exemplary embodiment of the present disclosure, the LPO calibration process can be performed on a next warm-up sequence following the calibration operation of the crystal oscillator 102 of the crystal warm-up detector 220.

In an exemplary embodiment of the present disclosure, the processing unit 238, crystal edge detector 230, LPO edge detector 232, crystal register 234, LPO register 236, and memory 240 are configured to calibrate LPO's low-power clock reference signal 310. In particular, the processing unit 238 can perform sampling 360$_a$-360$_n$ of the crystal clock reference signal 308, where each sampling 360 is performed for a single clock cycle of the LPO's low-power clock reference signal 310. For the purpose of this discussion, and as discussed in more detail below, the crystal edge detector 230 and the LPO edge detector 232 are configured to detect the rising edges of various signals. However, it should be appreciated that the crystal edge detector 230 and the LPO edge detector 232 can be configured to detect the failing edges of the various signals, alternatively, or in addition to, the detection of the rising edges of the various signals.

For example, for each clock cycle of low-power clock reference signal 310, the crystal edge detector 230 can detect each rising edge of the crystal clock reference signal 308 and provide the crystal register 234 with the crystal edge detection signal 250 as an indication of each rising edge. The crystal register 234 can count the received crystal edge detection signals 250, and can store a corresponding value representing the total counted rising edges of crystal clock reference signal 308 that occur per clock cycle of low-power clock reference signal 310. That is, the total counted rising edges correspond to the number of clock cycles of the crystal clock reference signal 308 that have occurred within a single clock cycle of low-power clock reference signal 310.

The value stored in the crystal register 234 can be reset for each clock cycle of low-power clock reference signal 310. The processing unit 238 can initiate a reset of the crystal register 234 or the information stored within the crystal register 234 can be overwritten by the detected clock cycles of the crystal clock reference signal 308 during a next clock cycle of the low-power clock reference signal 310.

Similarly, the LPO edge detector 232 can be used to detect the rising edges of the low-power clock reference signal 110 (310 in FIG. 3B) and provide LPO register 236 with a LPO edge detection signal 252. The LPO register 236 can count the received LPO edge detection signals 252 and can store a corresponding value representing the total counted rising edges of the low-power clock reference signal 110.

In an exemplary embodiment of the present disclosure, the processing unit 238 can monitor the crystal register 234 and the LPO register 236 in performing the LPO calibration operation. In particular, the processing unit 238 can, for each clock cycle of low-power clock reference signal 310, compare the value of the clock cycles of the crystal clock reference signal 308 stored in the crystal register 234 with $C_{warm}$ (the total clock cycles of crystal clock reference signal 308 determined in the calibration illustrated in FIG. 3A). When the processing unit 238 determines that the number of clock cycles of the crystal clock reference signal 308 stored in the crystal register 234 equals $C_{warm}$, the processing unit 238 determines that the crystal oscillator 102 is warmed up.

At this time, the processing unit 238 can read the value stored in the LPO register 236. This value ($L_{warm}$) is the total number of clock cycles of the LPO's low-power clock reference signal 310 that have passed before the crystal oscillator 102 has warmed up. That is, the total number of clock cycles of the low-power clock reference signal 310 ($L_{warm}$) can indicate the actual time ($t_{warm}$) needed for the crystal oscillator 102 to warm-up. The crystal oscillator 102 warm-up time ($t_{warm}$) can be calculated using the following equation:

$$t_{warm} = \frac{L_{warm}}{f_{LPO}},$$

where $L_{warm}$ is the number of lock cycles of the LPO's low-power clock reference signal 310 and $f_{LPO}$ is the frequency of the LPO's low-power clock reference signal 310. For example, if the frequency of the LPO's low-power clock reference signal 310 ($f_{LPO}$) is 32768 Hz, each clock cycle will be approximately 30.5 microseconds (μs).

Further, as illustrated in FIG. 3B, $t_{warm}$ occurs prior to the manufacturer-specified minimum crystal warm-up time $t_{min}$. That is, the actual time needed for the crystal oscillator 102 to warm up is less than the manufacturer-specified minimum crystal warm-up time $t_{min}$. Therefore, the system 100 can remain in a low-power mode for longer periods of time compared to a conventional system utilizing the manufacturer-specified minimum crystal warm-up time $t_{min}$.

Figure 4:
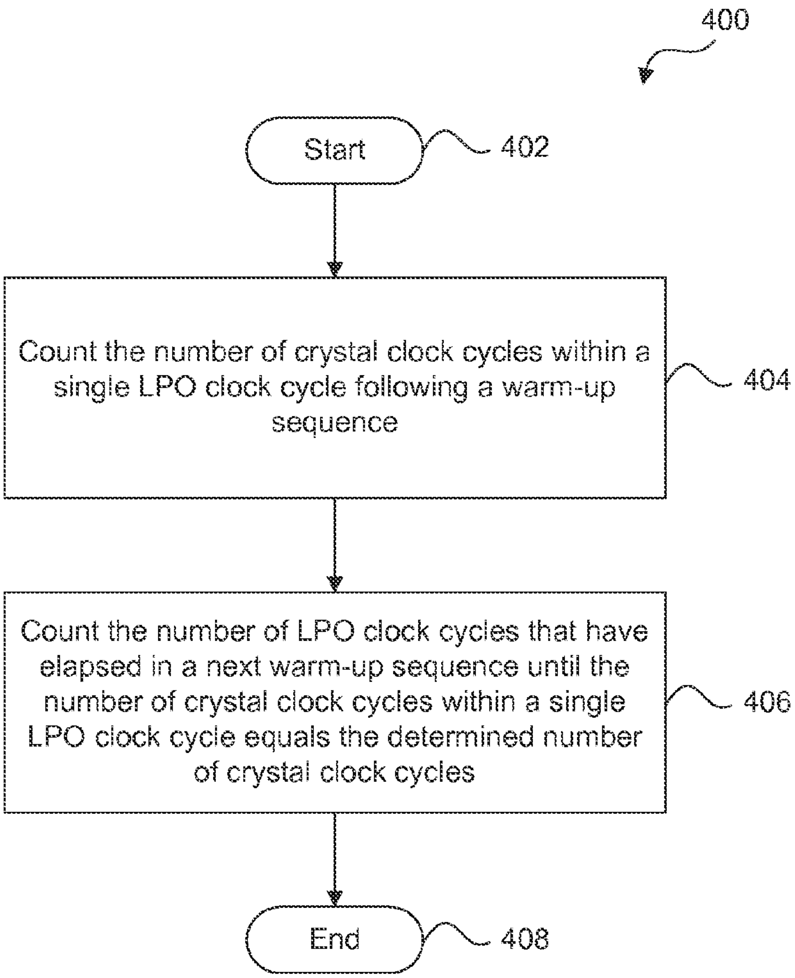
FIG. 4 illustrates a method of calibrating a crystal warm-up detector in accordance with an exemplary embodiment of the present disclosure.

FIG. 4 illustrates a flowchart 400 of a method of calibrating the crystal warm-up detector 220 in an exemplary embodiment of the present disclosure. The method of flowchart 400 is described with continued reference to FIGS. 1-3B.

The method of flowchart 400 begins at step 402 and transitions to step 404, where the crystal warm-up detector 220 performs the calibration of the crystal oscillator 102. As discussed above with respect to FIG. 3A, the crystal warm-up detector 220 performs the calibration operation after the crystal oscillator 102 has been sufficiently warmed up (e.g., after a manufacturer-specified minimum crystal warm-up time ($t_{min}$)).

For example, the processing unit 238, in cooperation with the crystal edge detector 230, LPO edge detector 232, crystal register 234, LPO register 236, and memory 240, can count the number of clock cycles of the crystal clock reference signal 308 that are within a single cycle of the LPO's low-power clock reference signal 310, where the count is performed after a manufacturer-specified minimum crystal warm-up time ($t_{min}$). This counted value is the number of clock cycles of the crystal clock reference signal 308 that are within a single cycle of the LPO's low-power clock reference signal 310 when the crystal oscillator 102 is warmed up. The counted value may be stored in memory 240 and may be represented by variable $C_{warm}$. The calibration of the crystal oscillator 102 is discussed in more detail with respect to FIG. 5.

After step 404, the flowchart 400 transitions to step 406, where the crystal warm-up detector 220 performs a LPO calibration operation. As discussed above with respect to FIG. 3B, the crystal warm-up detector 220 performs the LPO calibration operation utilizing the counted number ($C_{warm}$) of clock cycles of the crystal clock reference signal 308 that are within a single cycle of the LPO's low-power clock reference signal 310 determined in step 404.

For example, in a subsequent warm-up sequence (e.g., a next sequence when the system transitions from a low-power mode to a normal-power mode), the processing unit 238, in cooperation with the crystal edge detector 230, LPO edge detector 232, crystal register 234, LPO register 236, and memory 240, can count the number of clock cycles of the LPO's low-power clock reference signal 310 that have occurred up to the time when the processing unit 238 has determined that the current number of clock cycles of the crystal clock reference signal 308 within each clock cycle of the LPO's low-power clock reference signal 310 equals $C_{warm}$ (the number of clock cycles of the crystal clock reference signal 308 that are within a single cycle of the LPO's low-power clock reference signal 310 determined in step 404). The LPO calibration operation is discussed in more detail with respect to FIG. 6.

After step 406, the flowchart 400 transitions to step 408, where the flowchart 400 ends.

Figure 5:
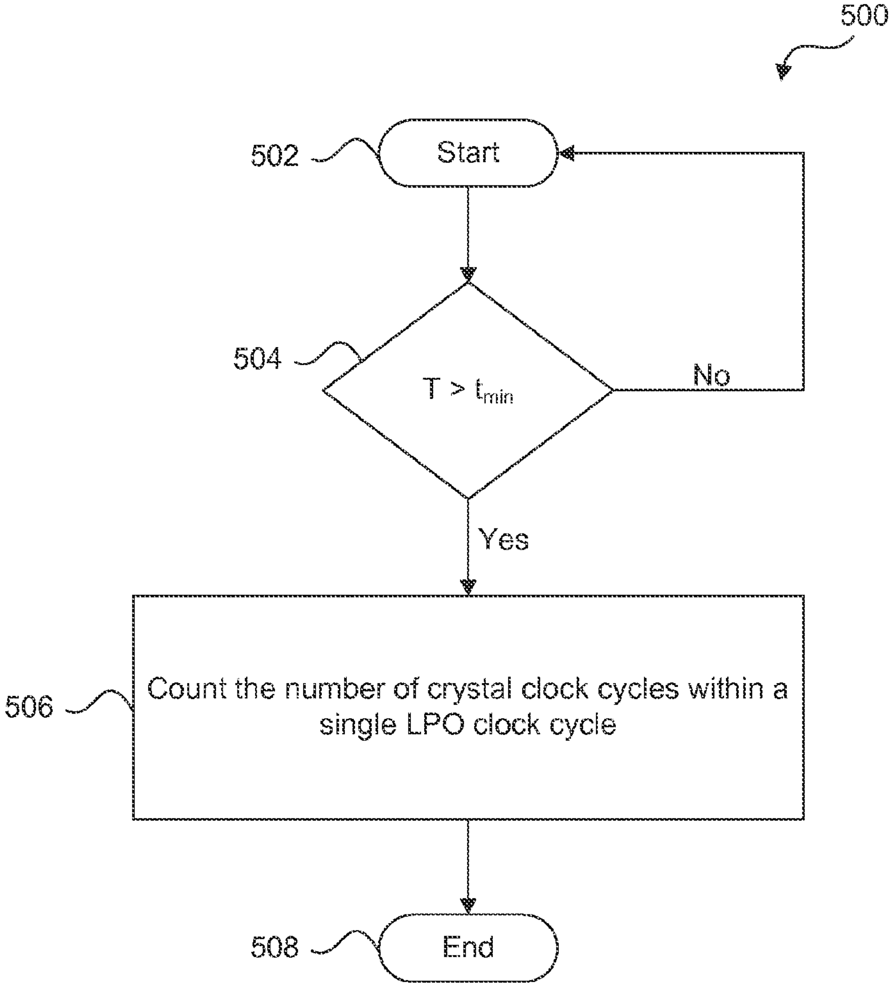
FIG. 5 illustrates a method of calibrating a crystal warm-up detector in accordance with an exemplary embodiment of the present disclosure.

FIG. 5 illustrates a flowchart 500 of a method of calibrating a crystal warm-up detector 220 in an exemplary embodiment of the present disclosure. The method of flowchart 500 is described with continued reference to FIGS. 1-4, and with particular reference to FIG. 3A. The steps of the method of flowchart 500 are not limited to the order described below, and the various steps may be performed in a different order. Further, two or more steps of the method of flowchart 500 may be performed simultaneously with each other.

The method of flowchart 500 begins at step 502 and transitions to step 504, where the processing unit 238 determines if the system 100 has been operating in a normal-power mode longer than a manufacturer-specified minimum crystal warm-up time $t_{min}$ (i.e., the crystal oscillator 102 is in a warmed-up state).

For example, the processing unit 238 compares the current time in which the system 100 has been operating in a normal-power mode with a manufacturer-specified minimum crystal warn-up time $t_{min}$. That is, this comparison ensures that the crystal oscillator 102 is in a warmed-up state.

If the time the system 100 has been operating in a normal-power mode is greater than the manufacturer-specified minimum crystal warm-up time $t_{min}$ (YES at step 504), the flowchart 500 transitions to step 506. If the time the system 100 has been operating in a normal-power mode is less than or equal to the manufacturer-specified minimum crystal warm-up time $t_{min}$ (NO at step 504), the flowchart 500 repeats step 504.

At step 506, the processing unit 238, in cooperation with the crystal edge detector 230, LPO edge detector 232, crystal register 234, LPO register 236, and memory 240, can determine the number of clock cycles of the crystal clock reference signal 308 that are within a single cycle of the LPO's low-power clock reference signal 310.

For example, the processing unit 238 can count the rising edges of the crystal clock reference signal 308 detected by the crystal edge detector 230 (and stored in the crystal register 234) for a single clock cycle of LPO's low-power clock reference signal 310. The processing unit 238 can determine when a single clock cycle of the LPO's low-power clock reference signal 310 has been completed by counting the rising edges detected by the LPO edge detector 232 and stored in the LPO register 236. The counted value of the rising edges of the crystal clock reference signal 308 may be stored in memory 240 and may be represented by variable $C_{warm}$.

After step 506, the flowchart 500 transitions to step 508, where the flowchart 500 ends.

Figure 6:
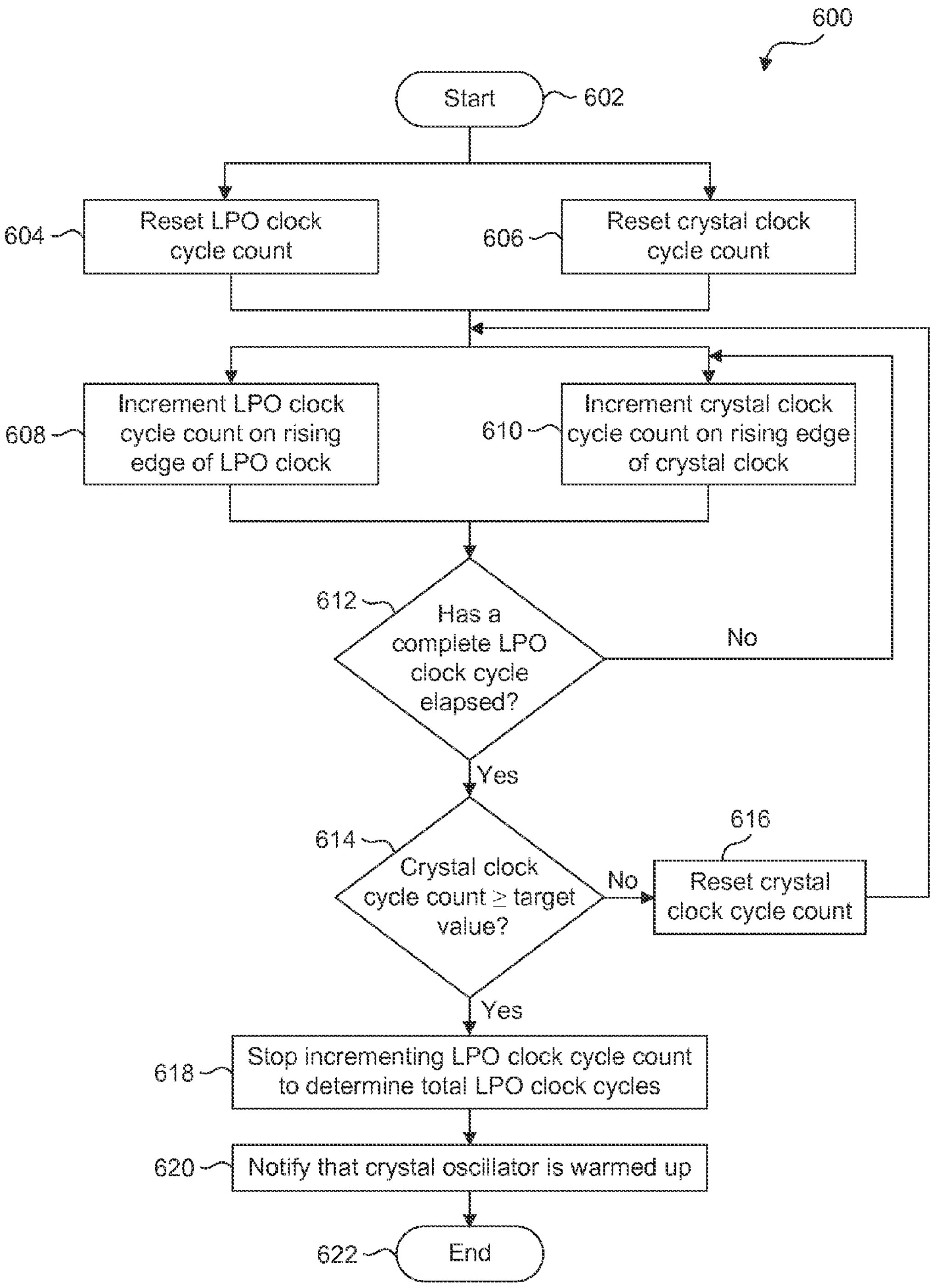
FIG. 6 illustrates a method of calibrating a crystal warm-up detector in accordance with an exemplary embodiment of the present disclosure.

FIG. 6 illustrates a flowchart 600 of a method of calibrating the crystal warm-up detector 220 with respect to the LPO in an exemplary embodiment of the present disclosure. The method of flowchart 600 is described with continued reference to FIGS. 1-5, and with particular reference to FIG. 3B. The steps of the method of flowchart 600 are not limited to the order described below, and the various steps may be performed in a different order. Further, two or more steps of the method of flowchart 600 may be performed simultaneously with each other.

The method of flowchart 600 begins at step 602 and transitions to steps 604 and 606. At step 604, a count of the rising edges of the LPO's low-power clock reference signal 310 stored in the LPO register 236 can be reset. Similarly, at step 606, a count of the rising edges of the crystal clock reference signal 308 stored in the crystal register 234 can be reset. In an exemplary embodiment of the present disclosure, the LPO register 236 and the crystal register 234 can be reset simultaneously.

For example, to initiate the calibration operation, the processing unit 238 can control LPO register 236 and the crystal register 234 to reset. In particular, the processing unit 238 can control the LPO register 236 and the crystal register 234 to reset simultaneously.

After steps 604 and 606, the flowchart 600 transitions to steps 608 and 610. At step 608, the LPO register 236 can increment a count of the rising edges of the LPO's low-power clock reference signal 310 stored in the LPO register 236. Similarly, at step 610, the crystal register 234 can increment a count of the rising edges of the crystal clock reference signal 308 stored in the crystal register 234. In an exemplary embodiment of the present disclosure, the incrementing of the LPO register 236 and the crystal register 234 can be performed simultaneously.

For example, LPO register 236 can increment a count of the rising edges of the LPO's low-power clock reference signal 310 stored in the LPO register 236 based on the LPO edge detection signal 252 provided by the LPO edge detector 232. Similarly, the crystal register 234 can increment a count of the rising edges of the crystal clock reference signal 308 stored in the crystal register 234 based on the crystal edge detection signal 250 provided by the crystal edge detector 230.

After steps 608 and 610, the flowchart 600 transitions to step 612, where processing unit 238 can determine if a complete clock cycle of the LPO's low-power clock reference signal 310 has elapsed.

For example, the processing unit 238 can monitor a counted value of the rising edges of the LPO's low-power clock reference signal 310 stored in the LPO register 236. If the processing unit 238 determines that a clock cycle has not been completed (NO at step 612), the flowchart 600 can transition to step 610. If the processing unit 238 determines that a clock cycle has been completed (YES at step 612), the flowchart 600 can transition to step 614.

At step 614, processing unit 238 can compare the number of clock cycles of the crystal clock reference signal 308 that have elapsed with a crystal clock target value. The crystal clock target value can be the number of crystal clock cycles for a single clock cycle of LPO's low-power clock reference signal 310 that has been previously determined at a time when the crystal oscillator 102 was warmed up (e.g., $C_{warm}$).

For example, the processing unit 238 can count the rising edges of the crystal clock reference signal 308 detected by the crystal edge detector 230 and stored in the crystal register 234. If the counted number of rising edges of the crystal clock reference signal 308 is equal to or greater than the crystal clock target value up (e.g., $C_{warm}$) (YES at step 614), the flowchart 600 can transition to step 618. If the counted number of rising edges of the crystal clock reference signal 308 is less than the crystal clock target value up (e.g., $C_{warm}$) (NO at step 614), the flowchart 600 can transition to step 616.

At step 616, a count of the rising edges of the crystal clock reference signal 308 stored in the crystal register 234 can be reset. For example, the processing unit 238 can control the crystal register 234 to reset similar to step 606. After step 616, the flowchart 600 transitions to steps 610 and 608.

At step 618, the counted value of the rising edges of the LPO's low-power clock reference signal 310 stored in the LPO register 236 can be determined.

For example, the processing unit 238 can read the counted value of the rising edges of the LPO's low-power clock reference signal 310 stored in the LPO register 236. The read value ($L_{warm}$) can represent the total number of clock cycles of the LPO's low-power clock reference signal 310 that have occurred before the crystal oscillator 102 has warmed up. That is, the total number of clock cycles of the low-power clock reference signal 310 ($L_{warm}$) can represent the actual time ($t_{warm}$) needed for the crystal oscillator 102 to warm-up. The read value ($L_{warm}$) can be stored in memory 240 by the processing unit 238.

After step 618, the flowchart 600 transitions to step 620, where the processing unit 238 can provide a notification to indicate that the crystal oscillator 102 is warmed up. The notification can include $t_{warm}$, which is indicative of the time that was needed for the crystal oscillator 102 to warm-up.

After step 620, the flowchart 600 transitions to step 622, where the flowchart 600 ends.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments within the spirit and scope of the disclosure. Therefore, the specification is not meant to limit the invention. Rather, the scope of the invention is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

The Detailed Description of the exemplary embodiments has revealed the general nature of the present disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

CONCLUSION

It is to be appreciated that the Detailed Description section, and not the Abstract section, is intended to be used to interpret the claims. The Abstract section may set forth one or more, but not all exemplary embodiments, and thus, is not intended to limit the disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the present disclosure. Thus, the invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. A method of calibrating a crystal warm-up detector of a crystal oscillator, the method comprising:

determining a count of clock cycles of the crystal oscillator within one or more clock cycles of a low-power oscillator (LPO) resulting in one or more counts of clock cycles of the crystal oscillator;

comparing the one or more counts of clock cycles of the crystal oscillator with a crystal clock cycle target value; and determining a number of elapsed clock cycles of the LPO based on the comparison of the one or more counts of clock cycles of the crystal oscillator with the crystal clock cycle target value.

2. The method according to claim 1, further comprising determining the crystal clock cycle target value by determining a count of clock cycles of the crystal oscillator within a single clock cycle of the one or more clock cycles of the LPO, wherein the determination of the crystal clock cycle target value is performed when the crystal oscillator is in a normal-power mode.

3. The method according to claim 2, wherein the determination of the crystal clock cycle target value is performed when a current operating duration of the crystal oscillator exceeds a pre-defined minimum crystal warm-up time.

4. The method according to claim 2, wherein the determination of the number of elapsed clock cycles of the LPO is performed during a subsequent transition of the crystal oscillator from a low-power mode to the normal-power mode.

5. The method according to claim 4, wherein the number of elapsed clock cycles of the LPO is determined during the subsequent transition of the crystal oscillator to the normal-power mode when a first of the one or more counts of clock cycles of the crystal oscillator is equal to or greater than the crystal clock cycle target value.

6. The method according to claim 5, further comprising resetting the one or more counts of clock cycles of the crystal oscillator when the one or more counts of clock cycles of the crystal oscillator is less than the crystal clock cycle target value.

7. The method according to claim 1, further comprising resetting the count of clock cycles of the crystal oscillator following a completed clock cycle of the one or more clock cycles of the LPO.

8. The method according to claim 1, wherein the crystal clock cycle target value is determined when the crystal oscillator is powered on and in a normal-power mode, and wherein the determination of the count of clock cycles of the crystal oscillator, the comparison of the one or more counts of clock cycles of the crystal oscillator, and the determination of the number of elapsed clock cycles of the LPO are performed during a subsequent transition of the crystal oscillator from a low-power mode to the normal-power mode.

9. A warm-up detection device, comprising:

a crystal edge detector configured to detect an edge of a crystal clock signal from a crystal oscillator;

a crystal register configured to store a count of crystal oscillator clock cycles;

a low-power oscillator (LPO) edge detector configured to detect an edge of an LPO clock signal from an LPO;

an LPO register configured to store a count of LPO clock cycles; and a processing unit configured to:

determine a count of crystal oscillator clock cycles within an LPO clock cycle based on the count of crystal oscillator clock cycles stored in the crystal register and the count of LPO clock cycles stored in the LPO register;

compare the determined count of crystal oscillator clock cycles with a crystal clock cycle target value; and determine a crystal warm-up time based on the comparison of the determined count of crystal oscillator clock cycles with the crystal clock cycle target value.

10. The device of claim 9, wherein the processing unit is configured to determine the crystal clock cycle target value by determining a count of crystal oscillator clock cycles that occur within a single LPO clock cycle.

11. The device of claim 10, wherein the crystal clock cycle target value is determined when the crystal oscillator is in a normal-power mode.

12. The device of claim 11, wherein the crystal warm-up time is determined during a subsequent transition of the crystal oscillator from a low-power mode to the normal-power mode.

13. The device of claim 12, wherein the crystal warm-up time is determined when the count of crystal oscillator clock cycles is equal to or greater than the crystal clock cycle target value.

14. The device of claim 13, wherein the processing unit is further configured to reset the count of crystal oscillator clock cycles when the count of crystal oscillator clock cycles is less than the crystal clock cycle target value.

15. The device of claim 9, wherein the crystal clock cycle target value is determined when the crystal oscillator is powered on and in an initial occurrence of a normal-power mode, and wherein the determination of the crystal warm-up time is performed when the crystal oscillator transitions from a low-power mode to a subsequent occurrence of the normal-power mode.

16. The device of claim 9, wherein the processing unit is further configured to:

utilize the crystal warm-up time to determine a transition time for a transition from a low-power mode to a normal-power mode; and send a notification to an external device after the transition time has elapsed that the crystal oscillator is in a warmed-up state.

17. The device of claim 9, wherein the processing unit is further configured to:

detect when the count of crystal oscillator clock cycles is equal to or greater than the crystal clock cycle target value;

read the count of LPO clock cycles from the LPO register when the count of crystal oscillator clock cycles is equal to or greater than the crystal clock cycle target value; and determine the crystal warm-up time based on the read count of LPO clock cycles and a frequency of the LPO.

18. A method of calibrating a crystal warm-up detector of a crystal oscillator, the method comprising:

determining a first count of crystal oscillator clock cycles that occur within a single clock cycle of a low-power oscillator (LPO) to determine a crystal clock cycle target value, wherein the determination of the first count of crystal oscillator clock cycles occurs after a transition of the crystal oscillator to a normal-power mode;

determining a second count of crystal oscillator clock cycles that occur within one or more clock cycles of the LPO during a transition of the crystal oscillator from a low-power mode to the normal-power mode and repeating the determining until the second count of crystal oscillator clock cycles is equal to or greater than the crystal clock cycle target value; and determining a number of LPO clock cycles that have elapsed during a time required for the second count of crystal oscillator clock cycles to be equal to or greater than the crystal clock cycle target value.

19. The method of claim 18, further comprising:

determining a warm-up time of the crystal oscillator based on the number of LPO clock cycles that have elapsed during the time required for the second count of crystal oscillator clock cycles to be equal to or greater than the crystal clock cycle target value, and a frequency of the LPO oscillator; and utilizing the warm-up time of the crystal oscillator to determine a transition time needed for the crystal oscillator to make a subsequent transition from the low-power mode to the normal-power mode.

20. The method of claim 19, further comprising sending a notification including the warm-up time to an external device.

* * * * *